(12) United States Patent
Zheng et al.

(10) Patent No.: US 10,885,863 B2
(45) Date of Patent: Jan. 5, 2021

(54) SHIFTING REGISTER AND DRIVING METHOD THEREOF, DRIVING CIRCUIT, AND DRIVING METHOD OF PANEL

(71) Applicants: Hefei Xinsheng Optoelectronics Technology Co., Ltd., Anhui (CN); BOE Technology Group Co., Ltd., Beijing (CN)

(72) Inventors: Mindong Zheng, Beijing (CN); Hui Wang, Beijing (CN); Yifeng Zou, Beijing (CN); Qiang Liu, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/523,593

(22) Filed: Jul. 26, 2019

(65) Prior Publication Data

US 2020/0168171 A1 May 28, 2020

(30) Foreign Application Priority Data

Nov. 23, 2018 (CN) .......................... 2018 1 1407611

(51) Int. Cl.
*G09G 3/36* (2006.01)
*G11C 19/28* (2006.01)

(52) U.S. Cl.
CPC ......... *G09G 3/3677* (2013.01); *G09G 3/3614* (2013.01); *G11C 19/28* (2013.01); *G09G 2310/0251* (2013.01); *G09G 2310/0286* (2013.01); *G09G 2310/08* (2013.01)

(58) Field of Classification Search
CPC ................ B65D 31/12; B65D 81/3261; G09G 2310/0251; G09G 2310/0286; G09G 2310/08; G09G 3/3614; G09G 3/3677; G09G 3/3696; G09G 3/20; G11C 19/28; G11C 19/184

See application file for complete search history.

(56) References Cited

U.S. PATENT DOCUMENTS

| 2010/0166136 A1* | 7/2010 | Tobita | ................ | G11C 19/184 377/67 |
| 2011/0228893 A1* | 9/2011 | Tobita | .................... | G11C 19/28 377/77 |
| 2011/0291712 A1* | 12/2011 | Tobita | .................. | G09G 3/3677 327/144 |

(Continued)

*Primary Examiner* — Richard J Hong
(74) *Attorney, Agent, or Firm* — Nath, Goldberg & Meyer; Joshua B. Goldberg; Stephanie F. Majkut

(57) ABSTRACT

The present disclosure provides a shifting register and a driving method thereof, a driving circuit, and a driving method of a panel. The shifting register includes: a shifting register unit circuit configured to transmit a signal of a first voltage terminal to an output terminal and an output control terminal according to a level of a pull-down node, and transmit a signal of a clock terminal to the output terminal and the output control terminal according to a level of a pull-up node; and a control unit circuit configured to transmit the signal of the first voltage terminal to the output terminal according to signals of a first control terminal and a second control terminal.

11 Claims, 5 Drawing Sheets

(56) References Cited

U.S. PATENT DOCUMENTS

2011/0298771 A1* 12/2011 Yoo .................. G09G 3/20
                                                    345/211
2016/0055814 A1*  2/2016 Yang ................ G09G 3/3677
                                                    345/213
2017/0287425 A1* 10/2017 Koo ................. G09G 3/3696

* cited by examiner

SHIFTING REGISTER AND DRIVING METHOD THEREOF, DRIVING CIRCUIT, AND DRIVING METHOD OF PANEL

CROSS-REFERENCE TO RELATED APPLICATIONS

This application claims priority from Chinese patent application No. 201811407611.2 filed on Nov. 23, 2018, the disclosure of which is incorporated herein by reference in its entirety.

TECHNICAL FIELD

The present disclosure relates to the technical field of display technology, and particularly relates to a shifting register and a driving method thereof, a driving circuit, and a driving method of a panel.

BACKGROUND

In an array substrate of a display device (such as a liquid crystal display device), a gate driving circuit may be used to provide signals for each gate line. The gate driving circuit is composed of a plurality of cascaded shifting registers. Each level of the shifting registers is connected to a gate line, each gate line is connected to a row of sub-pixels and each data line is connected to a column of sub-pixels. Further, each shifting register is connected to a shifting register of another level (e.g., an upper level or a lower level), so as to trigger other shifting registers to work or be triggered to work by other shifting registers.

SUMMARY

According to an aspect of the present disclosure, there is provided a shifting register, including: a shifting register unit circuit configured to transmit a signal of a first voltage terminal to an output terminal and an output control terminal according to a level of a pull-down node, and transmit a signal of a clock terminal to the output terminal and the output control terminal according to a level of a pull-up node; and a control unit circuit configured to transmit the signal of the first voltage terminal to the output terminal according to signals of a first control terminal and a second control terminal.

According to an embodiment of the present disclosure, the control unit circuit may include a first transistor and a second transistor. A first electrode of the first transistor is connected to the output terminal, and a second electrode of the first transistor is connected to the first voltage terminal. A gate electrode of the second transistor is connected to the first control terminal, a first electrode of the second transistor is connected to the second control terminal, and a second electrode of the second transistor is connected to the gate electrode of the first transistor.

According to an embodiment of the present disclosure, the shifting register unit circuit may include a storage capacitor, an input reset module circuit, an output module circuit, a pull-down control module circuit, and a pull-down module circuit. A first electrode of the storage capacitor is connected to the pull-up node, and a second electrode of the storage capacitor is connected to the output terminal. The input reset module circuit is configured to, based on signals of an input terminal and a reset terminal, write the signal of the input terminal or the signal of the first voltage terminal to the pull-up node. The output module circuit is configured to transmit the signal of the clock terminal to the output terminal and the output control terminal according to the level of the pull-up node. The pull-down control module circuit is configured to write the signal of the first voltage terminal or a signal of a second voltage terminal to the pull-down node according to the level of the pull-up node. The pull-down module circuit is configured to transmit the signal of the first voltage terminal to the output terminal and the output control terminal according to the level of the pull-down node.

According to an embodiment of the present disclosure, the input reset module circuit may include a third transistor and a fourth transistor. A gate electrode and a first electrode of the third transistor are connected to the input terminal, and a second electrode of the third transistor is connected to the pull-up node. A gate electrode of the fourth transistor is connected to the reset terminal, a first electrode of the fourth transistor is connected to the pull-up node, and a second electrode of the fourth transistor is connected to the first voltage terminal.

According to an embodiment of the present disclosure, the output module circuit may include a fifth transistor and a sixth transistor. A gate electrode of the fifth transistor is connected to the pull-up node, a first electrode of the fifth transistor is connected to the clock terminal, and a second electrode of the fifth transistor is connected to the output terminal. A gate electrode of the sixth transistor is connected to the pull-up node, a first electrode of the sixth transistor is connected to the clock terminal, and a second electrode of the sixth transistor is connected to the output control terminal.

According to an embodiment of the present disclosure, the pull-down control module circuit includes a seventh transistor and an eighth transistor. A gate electrode of the seventh transistor is connected to a pull-down control node, a first electrode of the seventh transistor is connected to the second voltage terminal, and a second electrode of the seventh transistor is connected to the pull-down node. A gate electrode of the eighth transistor is connected to the first electrode of the seventh transistor, a first electrode of the eighth transistor is connected to the second voltage terminal, and a second electrode of the eighth transistor is connected to the pull-down control node.

According to an embodiment of the present disclosure, the pull-down module circuit includes a ninth transistor, a tenth transistor, an eleventh transistor, a twelfth transistor, and a thirteenth transistor. A gate electrode of the ninth transistor is connected to the pull-down node, a first electrode of the ninth transistor is connected to the pull-up node, and a second electrode of the ninth transistor is connected to the first voltage terminal. A gate electrode of the tenth transistor is connected to the pull-down node, a first electrode of the tenth transistor is connected to the output terminal, and a second electrode of the tenth transistor is connected to the first voltage terminal. A gate electrode of the eleventh transistor is connected to the pull-down node, a first electrode of the eleventh transistor is connected to the output control terminal, and a second electrode of the eleventh transistor is connected to the first voltage terminal. A gate electrode of the twelfth transistor is connected to the pull-up node, a first electrode of the twelfth transistor is connected to the pull-down control node, and a second electrode of the twelfth transistor is connected to the first voltage terminal. A gate electrode of the thirteenth transistor is connected to the pull-up node, a first electrode of the thirteenth transistor is connected to the pull-down node, and a second electrode of the thirteenth transistor is connected to the first voltage terminal.

According to an embodiment of the present disclosure, all the transistors may be N-type transistors; or all the transistors may be P-type transistors.

According to another aspect of the present disclosure, there is provided a driving circuit including a plurality of cascaded shifting registers of the present disclosure. The output terminal of each level of shifting register is connected to a gate line, the first control terminal of each level, except the first level, of shifting register is connected to the output control terminal of a previous level of shifting register, and the second control terminal of each level, except the last level, of shifting register is connected to the output control terminal of a next level of shifting register.

According to another aspect of the present disclosure, there is provided a driving method of a shifting register, the shifting register including: a shifting register unit circuit configured to transmit a signal of a first voltage terminal to an output terminal and an output control terminal according to a level of a pull-down node, and transmit a signal of a clock terminal to the output terminal and the output control terminal according to a level of a pull-up node; and a control unit circuit configured to transmit the signal of the first voltage terminal to the output terminal according to signals of a first control terminal and a second control terminal. The driving method includes: transmitting, by the shifting register, the signal of the first voltage terminal to the output terminal during an output stage according to the signals of the first control terminal and the second control terminal.

According to an embodiment of the present disclosure, the shifting register unit circuit of the shifting register may include a storage capacitor, an input reset module circuit, an output module circuit, a pull-down control module circuit, and a pull-down module circuit. A first electrode of the storage capacitor is connected to the pull-up node, and a second electrode of the storage capacitor is connected to the output terminal. The input reset module circuit is configured to, based on signals of an input terminal and a reset terminal, write the signal of the input terminal or the signal of the first voltage terminal to the pull-up node. The output module circuit is configured to transmit the signal of the clock terminal to the output terminal and the output control terminal according to the level of the pull-up node. The pull-down control module circuit is configured to write the signal of the first voltage terminal or a signal of a second voltage terminal to the pull-down node according to the level of the pull-up node. The pull-down module circuit is configured to transmit the signal of the first voltage terminal to the output terminal and the output control terminal according to the level of the pull-down node. A turn-off signal is provided to the first voltage terminal, and a turn-on signal is provided to the second voltage terminal. The driving method includes: providing the turn-on signal to the input terminal and providing the turn-off signal to the reset terminal during a charging stage; providing the turn-on signal to the clock terminal and providing the turn-off signal to the input terminal and the reset terminal during the output stage; providing the turn-on signal to the reset terminal and the clock terminal, and providing the turn-off signal to the input terminal during a reset stage; and providing the turn-on signal to the clock terminal and providing the turn-off signal to the reset terminal and the input terminal during a holding stage.

According to another aspect of the present disclosure, there is provided a driving method of a panel, the panel including a plurality of gate lines, a plurality of data lines, and the driving circuit of the present disclosure. The output terminal of each shifting register of the driving circuit is connected to one corresponding gate line of the plurality of gate lines, each of the gate lines is connected to a row of sub-pixels, and each of the data lines is connected to a column of sub-pixels. A difference in a start time of an output stage between two adjacent levels of shifting register is one third of duration of the output stage, and the output stage of each shifting register includes a first sub-output stage, a second sub-output, and a third sub-output stage that do not overlap each other. The method includes: providing, at the first sub-output stage of a shifting register corresponding to an $n^{th}$ row of sub-pixels, a first data signal corresponding to an $n-2^{th}$ row of sub-pixels to each of the data lines; providing, at the second sub-output stage of the shifting register corresponding to the $n^{th}$ row of sub-pixels, a second data signal corresponding to an $n-1^{th}$ row of sub-pixels to each of the data lines, wherein the second data signal has an opposite polarity to the first data signal; and providing, at the third sub-output stage of the shifting register corresponding to the $n^{th}$ row of sub-pixels, a third data signal corresponding to the $n^{th}$ row of sub-pixels to each of the data lines, wherein the third data signal has the same polarity as the first data signal, wherein n is an integer greater than or equal to 3.

DETAILED DESCRIPTION

The present disclosure will be described in more detail below with reference to the accompanying drawings. Throughout the drawings, the same elements are indicated by similar reference signs. For the sake of clarity, various parts in the figures are not drawn to scale. Moreover, some well-known parts may not be shown in the figures.

For better understanding of the present disclosure, many specific details of the disclosure are described below, such as structures, materials, dimensions, processing, and techniques of the components. However, the present disclosure may be implemented without these specific details, as will be understood by those skilled in the art.

In order to improve driving ability of a gate driving circuit and avoid delay of gate signals due to a load on the gate driving circuit, the gate driving circuit usually provides a signal to each gate line in advance so that each gate line is turned on in advance to precharge each row of sub-pixels. For example, if each row of sub-pixels are precharged three rows in advance, each gate line may have a first sub-output stage, a second sub-output stage, and a third sub-output stage, wherein the first sub-output stage of an $n^{th}(n \geq 3)$ gate line may correspond to the third sub-output stage of an $n-2^{th}$ gate line (i.e., corresponding to a writing stage of the $n-2^{th}$ row of sub-pixels). At this time, a data line provides a signal corresponding to the $n-2^{th}$ row of sub-pixels, which signal is then used for precharging the $n^{th}$ row of sub-pixels. The second sub-output stage of the $n^{th}$ gate line may correspond to the third sub-output stage of an $n-1^{th}$ gate line (i.e. corresponding to a writing stage of the $n-1^{t}$ row of sub-pixels). At this time, a data line provides a signal corresponding to the $n-1^{th}$ row of sub-pixels, which signal is then used for precharging the $n^{th}$ row of sub-pixels. The third sub-output stage of the $n^{th}$ gate line is the writing stage of a current row of sub-pixels, at which time the data line provides a signal corresponding to the $n^{th}$ row of sub-pixels.

Figures 1A, 1B:
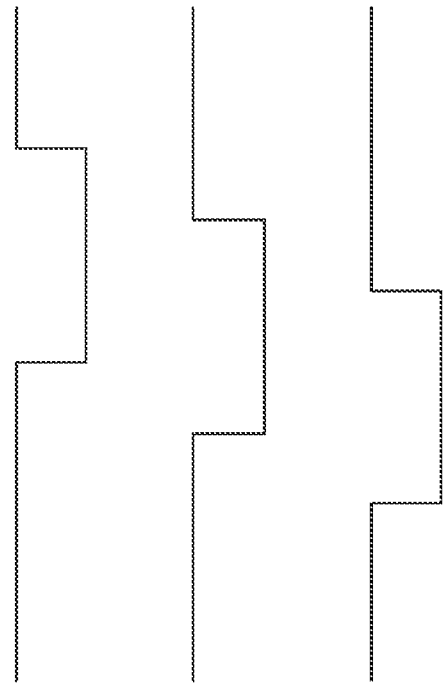
FIG. 1A is a schematic diagram showing polarities of data signals of sub-pixels when a liquid crystal display panel are dot-inverted.
FIG. 1B is a schematic diagram showing scanning signals of three adjacent gate lines of a liquid crystal display panel.

A dot inversion driving mode is such that, in one frame of image, each sub-pixel has a data signal of a polarity opposite to data signals of surrounding adjacent sub-pixels, as shown in FIG. 1A. In the dot inversion driving mode, minimum problems such as flicker and crosstalk are present in the liquid crystal display panel, and the display effect is optimal. A row inversion driving mode (not shown) is such that, in one frame of image, data signals of two adjacent rows of sub-pixels have opposite polarities.

As shown in FIG. 1B, G-out(1) to G-out(3) respectively represent scanning signals of three adjacent gate lines. If each row of sub-pixels is precharged three rows in advance, there will always be three gate lines turned on simultaneously. That is, each data line is simultaneously connected with three sub-pixels in one column. However, the data signals of the three sub-pixels have different polarities, and as a result, regardless of the polarity of the data signal provided by the data line, the sub-pixel cannot be precharged. For example, if a sub-pixel requires a negative data signal, a data signal precharging the sub-pixel positively will only affect normal charging of the sub-pixel and make the sub-pixel fail to be effectively precharged. Therefore, this precharging scheme is not applicable in a dot inversion or row inversion driving mode.

According to the shifting register and the driving method thereof provided by the embodiments of the present disclosure, the above described precharging scheme may be performed in a driving mode based on dot inversion or row inversion.

Figure 2:
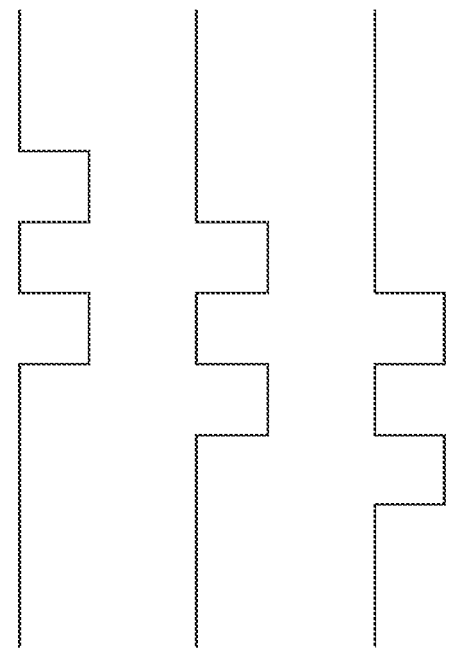
FIG. 2 is a schematic diagram showing scanning signals of three adjacent gate lines of a liquid crystal display panel according to an embodiment of the present disclosure.
Figure 3:
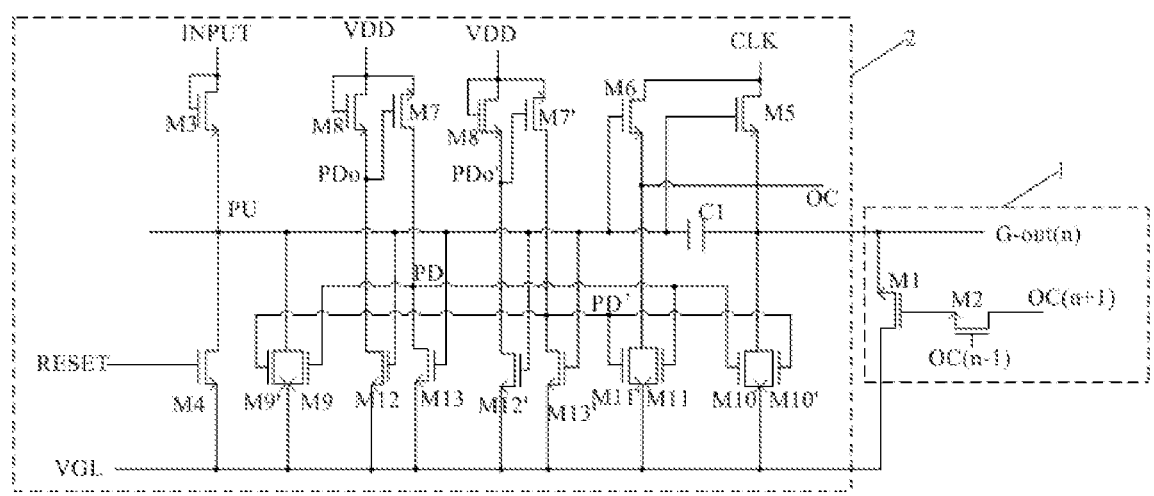
FIG. 3 is a schematic diagram showing a circuit structure of a shifting register according to an embodiment of the present disclosure.

FIG. 2 is a schematic diagram showing scanning signals of three adjacent gate lines of a liquid crystal display panel according to an embodiment of the present disclosure, and FIG. 3 is a schematic diagram showing a circuit structure of a shifting register according to an embodiment of the present disclosure.

Referring to FIGS. 2 and 3, in an embodiment of the present disclosure, there is provided a shifting register, including: a shifting register unit circuit 2 configured to transmit a signal of a first voltage terminal VGL to an output terminal G-out(n) and an output control terminal OC according to a level of a pull-down node PD, and transmit a signal of a clock terminal CLK to the output terminal G-out(n) and the output control terminal OC according to a level of a pull-up node PU; and a control unit circuit 1 configured to transmit the signal of the first voltage terminal VGL to the output terminal G-out(n) according to signals of a first control terminal OC(n-1) and a second control terminal OC(n+1).

The output terminal G-out(n) may be connected to a gate line, and the signal output by the output terminal G-out(n) may be controlled by the signals of the first control terminal OC(n-1) and the second control terminal OC(n+1). That is, in the case where an original output of the output terminal G-out(n) should be a turn-on signal, it may be determined whether the gate line connected to the shifting register provides a turn-on signal according to the signals of the first control terminal OC(n-1) and the second control terminal OC(n+1). In particular, when each row of sub-pixels is precharged, the shifting register according to the embodiments of the present disclosure can more flexibly control the signal provided by the gate line, and thus a dot inversion or row inversion driving mode can be employed.

As shown in FIG. 3, the control unit circuit 1 may include a first transistor M1 and a second transistor M2. A first electrode of the first transistor M1 is connected to the output terminal G-out(n), and a second electrode is connected to the first voltage terminal VGL. A gate electrode of the second transistor M2 is connected to the first control terminal OC(n-1), a first electrode is connected to the second control terminal OC(n+1), and a second electrode is connected to the gate electrode of the first transistor M1.

According to an embodiment the present disclosure, the shifting register unit circuit 2 includes a storage capacitor C1, an input reset module circuit, an output module circuit, a pull-down control module circuit, and a pull-down module circuit.

A first electrode of the storage capacitor C1 is connected to the pull-up node PU, and a second electrode is connected to the output terminal G-out(n).

The input reset module circuit is configured to, based on signals of an input terminal INPUT and a reset terminal RESET, write the signal of the input terminal INPUT or the signal of the first voltage terminal VGL to the pull-up node PU.

The output module circuit is configured to transmit a signal of a clock terminal CLK to the output terminal G-out(n) and the output control terminal OC according to a level of the pull-up node PU.

The pull-down control module circuit is configured to write the signal of the first voltage terminal VGL or a signal of a second voltage terminal VDD to the pull-down node PD according to the level of the pull-up node PU.

The pull-down module circuit is configured to transmit the signal of the first voltage terminal VGL to the output terminal G-out(n) and the output control terminal OC according to a level of the pull-down node PD.

According to an embodiment of the present disclosure, the input reset module circuit may include a third transistor M3 and a fourth transistor M4.

A gate electrode and a first electrode of the third transistor M3 are connected to the input terminal INPUT, and the second electrode is connected to the pull-up node PU.

A gate electrode of the fourth transistor M4 is connected to the reset terminal RESET, a first electrode is connected to the pull-up node PU, and a second electrode is connected to the first voltage terminal VGL.

According to an embodiment of the present disclosure, the output module circuit may include a fifth transistor M5 and a sixth transistor M6.

A electrode of the fifth transistor M5 is connected to the pull-up node PU, a first electrode is connected to the clock terminal CLK, and a second electrode is connected to the output terminal G-out(n).

A gate electrode of the sixth transistor M6 is connected to the pull-up node PU, a first electrode is connected to the clock terminal CLK, and a second electrode is connected to the output control terminal OC.

According to an embodiment the present disclosure, the pull-down control module circuit may include a seventh transistor M7 and an eighth transistor M8.

A gate electrode of the seventh transistor M7 is connected to a pull-down control node PDo, a first electrode is connected to the second voltage terminal VDD, and a second electrode is connected to the pull-down node PD.

A gate electrode of the eighth transistor M8 is connected to the first electrode of the seventh transistor M7, a first electrode is connected to the second voltage terminal VDD, and a second electrode is connected to the pull-down control node PDo.

According to an embodiment the present disclosure, the pull-down module circuit may include ninth to thirteenth transistors M9 to M13.

A gate electrode of the ninth transistor M9 is connected to the pull-down node PD, a first electrode is connected to the pull-up node PU, and a second electrode is connected to the first voltage terminal VGL.

A gate electrode of the tenth transistor M10 is connected to the pull-down node PD, a first electrode is connected to the output terminal G-out(n), and a second electrode is connected to the first voltage terminal VGL.

A gate electrode of the eleventh transistor M11 is connected to the pull-down node PD, a first electrode is connected to the output control terminal OC, and a second electrode is connected to the first voltage terminal VGL.

A gate electrode of the twelfth transistor M12 is connected to the pull-up node PU, a first electrode is connected to the pull-down control node PDo, and a second electrode is connected to the first voltage terminal VGL.

A gate electrode of the thirteenth transistor M13 is connected to the pull-up node PU, a first electrode is connected to the pull-down node PD, and a second electrode is connected to the first voltage terminal VGL.

According to an embodiment the present disclosure, the shifting register unit circuit 2 may further include an auxiliary pull-down control module circuit, and an auxiliary pull-down module circuit.

The auxiliary pull-down control module circuit may include an auxiliary seventh transistor M7' and an auxiliary eighth transistor M8'.

A gate electrode of the auxiliary seventh transistor M7' is connected to an auxiliary pull-down control node PDo', a first electrode is connected to an auxiliary second voltage terminal VDD', and a second electrode is connected to an auxiliary pull-down node PD'.

A gate electrode of the auxiliary eighth transistor M8' is connected to the first electrode of the auxiliary seventh transistor M7', a first electrode is connected to the auxiliary second voltage terminal VDD', and a second electrode is connected to the auxiliary pull-down control node PDo'.

The auxiliary pull-down module circuit may include auxiliary ninth to thirteenth transistors M9' to M13'.

A gate electrode of the auxiliary ninth transistor M9' is connected to the auxiliary pull-down node PD', a first electrode is connected to the pull-up node PU, and a second electrode is connected to the first voltage terminal VGL.

A gate electrode of the auxiliary tenth transistor M10' is connected to the auxiliary pull-down node PD', a first electrode is connected to the output terminal G-out(n), and a second electrode is connected to the first voltage terminal VGL.

A gate electrode of the auxiliary eleventh transistor M11' is connected to the auxiliary pull-down node PD', a first electrode is connected to the output control terminal OC, and a second electrode is connected to the first voltage terminal VGL.

A gate electrode of the auxiliary twelfth transistor M12' is connected to the pull-up node PU, a first electrode is connected to the auxiliary pull-down control node PDo', and a second electrode is connected to the first voltage terminal VGL.

A gate electrode of the auxiliary thirteenth transistor M13' is connected to the pull-up node PU, a first electrode is connected to the auxiliary pull-down node PD', and a second electrode is connected to the first voltage terminal VGL.

It should be noted that since the auxiliary pull-down control module circuit and the pull-down control module circuit, and the auxiliary pull-down module circuit and the pull-down module circuit respectively have the same structure with each other and have the same connection relationship with other module circuits, the auxiliary pull-down control module circuit and the pull-down control module circuit have the same function and working principle, and the auxiliary pull-down module circuit and the pull-down module circuit have the same function and working principle. In the following description, only the pull-down control module circuit and the pull-down module circuit are described, and descriptions of the auxiliary pull-down control module circuit and the auxiliary pull-down module circuit are omitted.

According to an embodiment the present disclosure, all the transistors may be N-type transistors; or all the transistors may be P-type transistors.

In an embodiment of the present disclosure, there is further provided a driving method of a shifting register for driving the shifting register according to various embodiments of the present disclosure. The driving method includes: transmitting, by the shifting register, the signal of the first voltage terminal VGL to the output terminal G-out(n) during an output stage according to the signals of the first control terminal OC(n−1) and the second control terminal OC(n+1).

The output terminal G-out(n) may be connected to a gate line. That is, it may be determined whether the gate line connected to the shifting register provides a turn-on signal according to the signals of the first control terminal OC(n−1) and the second control terminal OC(n+1). In particular, when each row of sub-pixels is precharged, the shifting register according to the embodiments of the present disclosure can more flexibly control the signal provided by the gate line, and thus a dot inversion or row inversion driving mode can be employed.

Figure 4:
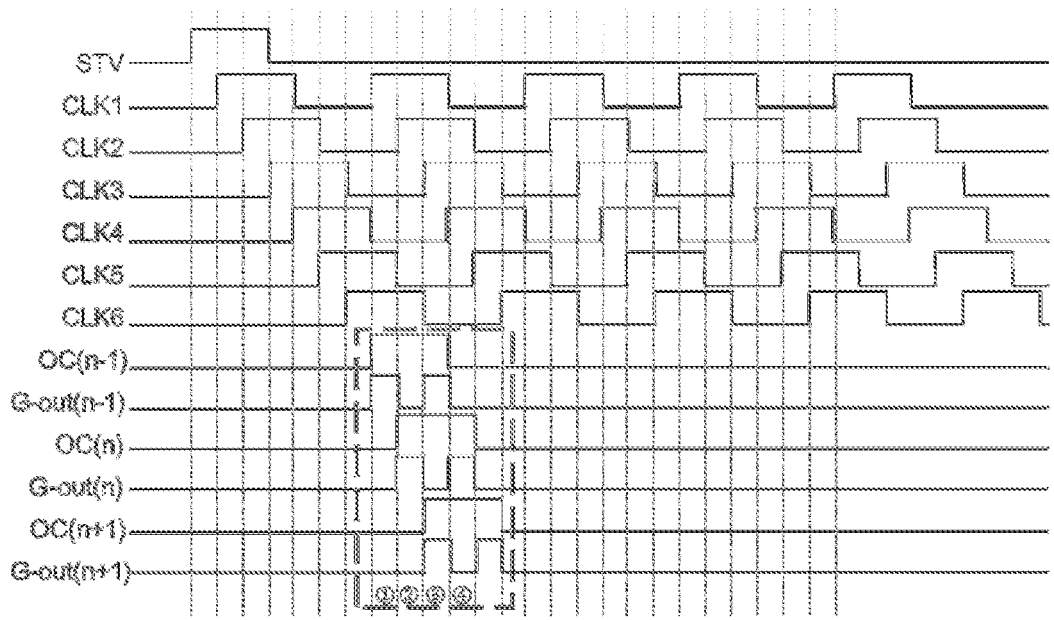
FIG. 4 is a timing diagram of driving of the shifting register shown in FIG. 3.

FIG. 4 is a timing diagram of driving of the shifting register shown in FIG. 3.

As shown in FIG. 4, in the method, the turn-off signal is continuously provided to the first voltage terminal VGL, and the turn-on signal is continuously provided to the second voltage terminal VDD.

The turn-on signal is provided to the input terminal INPUT and the turn-off signal is provided to the reset terminal RESET during a charging stage.

The term "turn-on signal" refers to a signal that turns on a transistor when applied to the gate electrode of the transistor, and the term "turn-off signal" refers to a signal that turns off a transistor when applied to the gate electrode of the transistor.

Hereinafter, an example in which all transistors are N-type transistors and thus the turn-on signal is a higher level signal and the turn-off signal is a lower level signal will be described.

In this stage, the input terminal INPUT may have a higher level so that the higher level of the input terminal INPUT is transmitted to the pull-up node PU via the third transistor M3 so that the pull-up node PU has a higher level, and then the twelfth transistor M12 and the thirteenth transistor M13 are turned on. Even if the second voltage terminal VDD has a higher level, the seventh transistor M7 is turned off, the pull-down node PD has a lower level, and the tenth transistor M10 and the eleventh transistor M11 are turned off.

At the same time, the higher level of the pull-up node PU also turns on the sixth transistor M6, and introduces a lower level of the clock terminal CLK into the output control terminal OC and the second electrode of the storage capacitor C1 so that the output control terminal OC and the output terminal G-out(n) of the shifting register output a lower level. Thus, the capacitor C1 is charged.

During the output stage, the turn-on signal is provided to the clock terminal CLK, and the turn-off signal is provided to the input terminal INPUT and the reset terminal RESET.

In this stage, a higher level may be input to the clock terminal CLK, and a lower level may be input to the input terminal INPUT and the reset terminal RESET. Due to a bootstrap effect of the capacitor C1, the level of the pull-up node PU is further increased (the third transistor M3 is turned off at this time) and stays high. Therefore, the pull-down node PD remains a lower level, and the tenth transistor M10 and the eleventh transistor M11 are turned off. The higher level of the pull-up node PU turns on the fifth transistor M5 and the sixth transistor M6 so that the output control terminal OC of the shifting register outputs the higher level of the clock terminal CLK, while the output terminal G-out(n) needs to determine whether to output a higher level according to the signals of the first control terminal OC(n−1) and the second control terminal OC(n+1).

If the first control terminal OC(n−1) and the second control terminal OC(n+1) both have a higher level, the first transistor M1 and the second transistor M2 are both turned on so that the output terminal G-out(n) outputs a lower level of the first voltage terminal VGL; if the first control terminal OC(n−1) and the second control terminal OC(n+1) both have a lower level, the first transistor M1 and the second transistor M2 are both turned off so that the output terminal G-out(n) outputs a higher level of the clock terminal CLK; if the first control terminal OC(n−1) has a higher level and the second control terminal OC(n+1) has a lower level, the first transistor M1 is turn off while the second transistor M2 is turned on so that the output terminal G-out(n) outputs a higher level of the clock terminal CLK; and if the first control terminal OC(n−1) has a lower level and the second control terminal OC(n+1) has a higher level, the first transistor M1 and the second transistor M2 are both turned off so that the output terminal G-out(n) outputs a higher level of the clock terminal CLK.

During the reset stage, the turn-on signal is provided to the reset terminal RESET and the clock terminal CLK, and the turn-off signal is provided to the input terminal INPUT.

In this stage, a higher level may be input to the reset terminal RESET and the clock terminal CLK so that the fourth transistor M4 is turned on, and the lower level of the first voltage terminal VGL is introduced into the pull-up node PU. The capacitor C1 is no longer charged, and the fifth transistor M5 and the sixth transistor M6 are turned off. The output control terminal OC and the output terminal G-out(n) of the shifting register output a lower level.

During the holding stage, the turn-on signal is provided to the clock terminal CLK and the turn-off signal is provided to the reset terminal RESET and the input terminal INPUT.

In this stage, a lower level may be input to the input terminal INPUT and the reset terminal RESET, and a higher level may be input to the clock terminal CLK. Since the second voltage terminal VDD has a higher level, the eighth transistor M8 is turned on so that the pull-down control node PDo has a higher level and so that the seventh transistor M7 is turned on. The pull-down node PD has a higher level, and thus the eleventh transistor M11 and the tenth transistor M10 are turned on. The lower level of the first voltage terminal VGL is provided to the control terminal OC and the output terminal G-out(n) via the eleventh transistor M11 and the tenth transistor M10, respectively.

In this embodiment, during the output stage, by controlling the levels of the first control terminal OC(n−1) and the second control terminal OC(n+1), an original higher level (e.g., a turn-on signal) of the output terminal is changed into a lower level (e.g., a turn-off signal) during a part of the time period, so as to prevent sub-pixels in the current row from being precharged by an incorrect polarity and to realize flexible control.

Figure 5A:
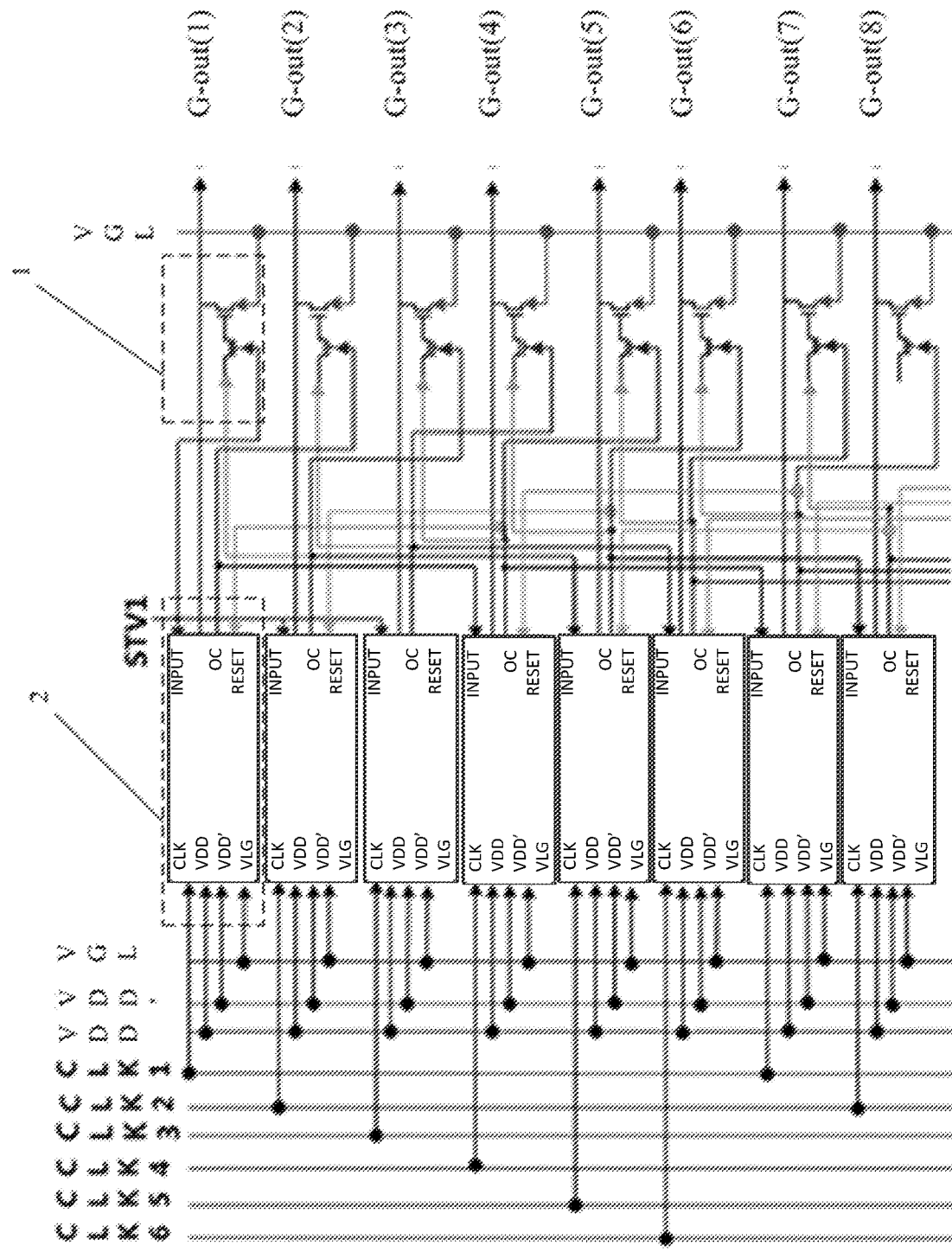
FIG. 5A is a schematic structural diagram of a driving circuit according to an embodiment of the present disclosure.
Figure 5B:
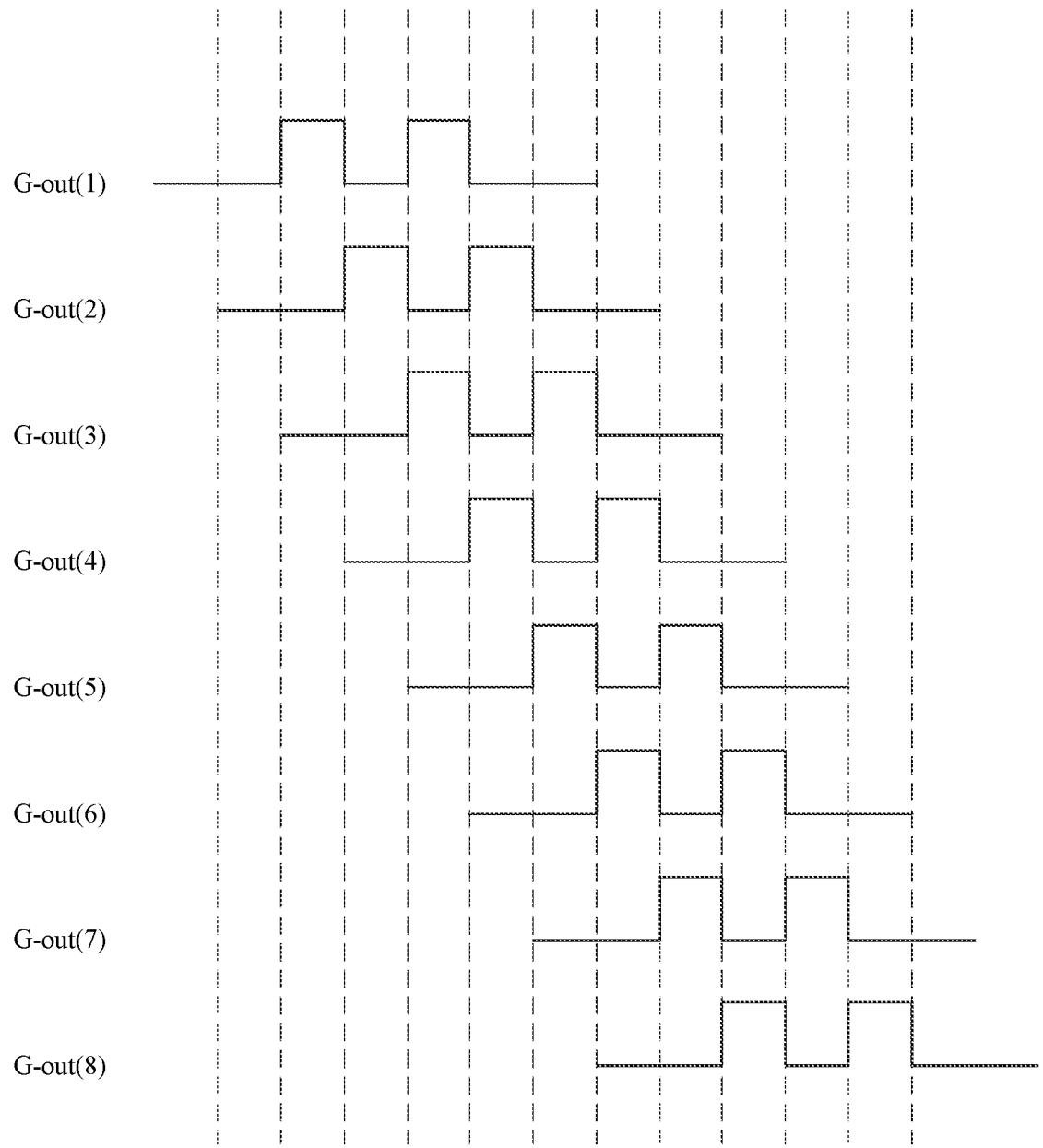
FIG. 5B is a schematic diagram showing scanning signals of gate lines of a driving circuit according to an embodiment of the present disclosure.

FIG. 5A is a schematic structural diagram of a driving circuit according to an embodiment of the present disclosure; and FIG. 5B is a schematic diagram showing scanning signals of gate lines of a driving circuit according to an embodiment of the present disclosure.

As shown in FIGS. 5A and 5B, in an embodiment of the present disclosure, there is provided a driving circuit including a plurality of cascaded shifting registers according to various embodiments of the present disclosure. The output terminal of each level of shifting register is connected to a gate line, the first control terminal OC(n−1) of each level, except the first level, of shifting register is connected to the output control terminal OC of a previous level of shifting register, and the second control terminal OC(n+1) of each level, except the last level, of shifting register is connected to the output control terminal OC of a next level of shifting register.

The first control terminal OC(n−1) of the first level of shifting register needs to be separately powered by a start terminal (such as STV1 in FIG. 5A), and the second control terminal OC(n+1) of the last level of shifting register also needs to be separately connected to a control signal terminal.

The signal output by the output terminal of each level of shifting register may be controlled by the signals of the first control terminal OC(n−1) and the second control terminal OC(n+1) of the shifting register. That is, it may be determined whether the gate line connected to the $n^{th}$ level of shifting register provides a turn-on signal according to the signals of the output control terminal OC of the $n-1^{th}$ level of shifting register and of the output control terminal OC of the $n+1^{th}$ level of shifting register.

It should be noted that the driving circuit is mainly applied in a dot inversion or row inversion driving mode. In the dot inversion or row inversion driving mode, two adjacent sub-pixels corresponding to each adjacent data line have signals of opposite polarities. When each row of sub-pixels needs to be precharged, the shifting register according to embodiments of the present disclosure can more flexibly control the signal provided by the gate line, thus realizing effective precharging of each row of sub-pixels.

For example, in the dot inversion driving mode, if each row of sub-pixels are precharged three rows in advance, then each gate line has a first sub-output stage, a second sub-output stage, and a third sub-output stage. For the $n^{th}$ level of shifting register, during the first sub-output stage, the data line provides a signal corresponding to the $n-2^{th}$ row of sub-pixels, and the $n^{th}$ row of sub-pixels has the same signal polarity as the n−2$^{th}$ row of sub-pixels. On the other hand, the output control terminals OCs of the n−1$^{th}$ level of shifting register and the n+1$^{th}$ level of shifting register both output a lower level signal so that the first transistor M1 and the second transistor M2 of the n$^{th}$ level of shifting register are both turned off, the output terminal G-out(n) of the n$^{th}$ level of shifting register has a higher level, and the data line charges the n−2$^{th}$ row of sub-pixels while precharging the n$^{th}$ row of sub-pixels with the same polarity. During the second sub-output stage, the data line provides a signal corresponding to the n−1$^{th}$ row of sub-pixels, and the n$^{th}$ row of sub-pixels has an opposite signal polarity to the n−1$^{th}$ row of sub-pixels. However, since the output control terminals OCs of the n−1 level of shifting register and of the n+1$^{th}$ level of shifting register both output a higher level signal during this stage, the first transistor M1 and the second transistor M2 of the n$^{th}$ level of shifting register are both turned on. Therefore, the output terminal G-out(n) of the n$^{th}$ level of shifting register has a lower level, thereby preventing the n$^{th}$ row of sub-pixels from receiving a signal of the opposite polarity. During the third sub-output stage, the output control terminals OCs the n−1$^{th}$ level of shifting register and of the n+1$^{th}$ level of shifting register both have a lower level, the first transistor M1 and the second transistor M2 are both turned off, the output terminal G-out(n) of the n$^{th}$ level of shifting register has a higher level, and the n$^{th}$ row of sub-pixels may receive a signal from itself.

Since the signals of the first voltage terminal VGL, the second voltage terminal VDD, and the auxiliary second voltage terminal VDD' of each level of shifting register are constant, unified signal lines may be used for providing signals to the first voltage terminal VGL, the second voltage terminal VDD, and the auxiliary second voltage terminal VDD' of each level of shifting register (such as lines VGL, VDD, and VDD' in FIG. 5A).

A difference in a start time of an output stage between adjacent shifting registers is ⅓ of duration of the output stage, i.e., ⅙ of a cycle (each cycle is a complete clock signal cycle). Therefore, six clock signal lines (CLK1 to CLK6 in FIG. 5A) are needed. The difference between two adjacent clock signal lines is ⅙ of a cycle, and CLK1 to CLK6 are sequentially connected to the clock terminal CLK of each level of shifting register.

The difference in the start time of the output stage between the n$^{th}$ level of shifting register and the n+3$^{th}$ level of shifting register is half a cycle. Therefore, the output control terminal OC (instead of the output terminal G-out (n), because in this embodiment, the output level of the output terminal G-out(n) is controlled by the control unit circuit) of the n$^{th}$ level of shifting register, except the last three levels of shifting register, should be connected to the input terminal INPUT of the n+3$^{th}$ level of shifting register, and connected to the reset terminal RESET of the n−3$^{th}$ level of shifting register. The input terminals INPUTs of the first three levels of shifting register may be connected to a separate signal terminal (STV1 in FIG. 5A), and the reset terminals RESETs of the last three levels of shifting register may also be connected to a separate signal terminal (not shown).

In an embodiment of the present disclosure, there is further provided a driving method of a panel, the panel including a plurality of gate lines, a plurality of data lines, and a driving circuit according to various embodiments of the present disclosure. The output terminal of each shifting register of the driving circuit is connected to one corresponding gate line of the plurality of gate lines, each of the gate lines is connected to a row of sub-pixels, and each of the data lines is connected to a column of sub-pixels. A difference in a start time of an output stage between two adjacent levels of shifting register is one third of duration of the output stage, and the output stage of each shifting register includes a first sub-output stage, a second sub-output, and a third sub-output stage that do not overlap each other. The method includes: providing, at the first sub-output stage of a shifting register corresponding to an n$^{th}$ row of sub-pixels, a first data signal corresponding to an n−2$^{th}$ row of sub-pixels to each of the data lines; providing, at the second sub-output stage of the shifting register corresponding to the n$^{th}$ row of sub-pixels, a second data signal corresponding to an n−1$^{th}$ row of sub-pixels to each of the data lines, wherein the second data signal has an opposite polarity to the first data signal; and providing, at the third sub-output stage of the shifting register corresponding to the n$^{th}$ row of sub-pixels, a third data signal corresponding to the n$^{th}$ row of sub-pixels to each of the data lines, wherein the third data signal has the same polarity as the first data signal, and n is an integer greater than or equal to 3.

The panel may be a liquid crystal display panel, an electronic paper, a mobile phone, a tablet PC, a television, a monitor, a notebook computer, a digital album, a navigator or any other product or component having a display function.

It should be noted that, in this context, relational terms such as "first" and "second", are used merely to distinguish one entity or operation from another without necessarily requiring or implying that there is any actual relationship or order between such entities or operations. Moreover, the term "comprise," "comprising" or any variant thereof means to be non-exclusive so that a process, method, item or device including a series of elements includes not only said elements, but also other elements not explicitly listed, or inherent elements of such processes, methods, items or devices. In the absence of more limitations, an element defined by "comprising a . . . " do not exclude the existence of additional identical elements in the process, method, item or device including the element.

The embodiments of the present disclosure are as described above, where not all details of the embodiments are elaborated, and the present disclosure is not intended to be limited to these specific embodiments. Obviously, many modifications and variations are possible in light of the above description. The present disclosure has chosen and described these specific embodiments in detail for better illustration of the principles and actual applications of the present disclosure so that those skilled in the art can make good use of the present disclosure as well as modified applications based on the present disclosure. The present disclosure is intended to be limited only by the claims and the full scope and equivalents thereof.

What is claimed is:

1. A shifting register, comprising:
   a shifting register unit circuit configured to transmit a signal of a first voltage terminal to an output terminal and an output control terminal according to a level of a pull-down node, and transmit a signal of a clock terminal to the output terminal and the output control terminal according to a level of a pull-up node; and
   a control unit circuit configured to transmit the signal of the first voltage terminal to the output terminal according to signals of a first control terminal and a second control terminal,
   wherein the control unit circuit comprises a first transistor and a second transistor, a first electrode of the first transistor is connected to the output terminal, and a second electrode of the first transistor is connected to the first voltage terminal, and a gate electrode of the second transistor is connected to the first control terminal, a first electrode of the second transistor is connected to the second control terminal, and a second electrode of the second transistor is connected to the gate electrode of the first transistor.

2. The shifting register according to claim 1, wherein the shifting register unit circuit comprises a storage capacitor, an input reset module circuit, an output module circuit, a pull-down control module circuit, and a pull-down module circuit, a first electrode of the storage capacitor is connected to the pull-up node, and a second electrode of the storage capacitor is connected to the output terminal, the input reset module circuit is configured to, based on signals of an input terminal and a reset terminal, write the signal of the input terminal or the signal of the first voltage terminal to the pull-up node, the output module circuit is configured to transmit the signal of the clock terminal to the output terminal and the output control terminal according to the level of the pull-up node, the pull-down control module circuit is configured to write the signal of the first voltage terminal or a signal of a second voltage terminal to the pull-down node according to the level of the pull-up node, and the pull-down module circuit is configured to transmit the signal of the first voltage terminal to the output terminal and the output control terminal according to the level of the pull-down node.

3. The shifting register according to claim 2, wherein the input reset module circuit comprises a third transistor and a fourth transistor, a gate electrode and a first electrode of the third transistor are connected to the input terminal, and a second electrode of the third transistor is connected to the pull-up node, and a gate electrode of the fourth transistor is connected to the reset terminal, a first electrode of the fourth transistor is connected to the pull-up node, and a second electrode of the fourth transistor is connected to the first voltage terminal.

4. The shifting register according to claim 3, wherein the output module circuit comprises a fifth transistor and a sixth transistor, a gate electrode of the fifth transistor is connected to the pull-up node, a first electrode of the fifth transistor is connected to the clock terminal, and a second electrode of the fifth transistor is connected to the output terminal, and a gate electrode of the sixth transistor is connected to the pull-up node, a first electrode of the sixth transistor is connected to the clock terminal, and a second electrode of the sixth transistor is connected to the output control terminal.

5. The shifting register according to claim 4, wherein the pull-down control module circuit comprises a seventh transistor and an eighth transistor, a gate electrode of the seventh transistor is connected to a pull-down control node, a first electrode of the seventh transistor is connected to the second voltage terminal, and a second electrode of the seventh transistor is connected to the pull-down node, and a gate electrode of the eighth transistor is connected to the first electrode of the seventh transistor, a first electrode of the eighth transistor is connected to the second voltage terminal, and a second electrode of the eighth transistor is connected to the pull-down control node.

6. The shifting register according to claim 5, wherein the pull-down module circuit comprises a ninth transistor, a tenth transistor, an eleventh transistor, a twelfth transistor, and a thirteenth transistor, a gate electrode of the ninth transistor is connected to the pull-down node, a first electrode of the ninth transistor is connected to the pull-up node, and a second electrode of the ninth transistor is connected to the first voltage terminal, a gate electrode of the tenth transistor is connected to the pull-down node, a first electrode of the tenth transistor is connected to the output terminal, and a second electrode of the tenth transistor is connected to the first voltage terminal, a gate electrode of the eleventh transistor is connected to the pull-down node, a first electrode of the eleventh transistor is connected to the output control terminal, and a second electrode of the eleventh transistor is connected to the first voltage terminal, a gate electrode of the twelfth transistor is connected to the pull-up node, a first electrode of the twelfth transistor is connected to the pull-down control node, and a second electrode of the twelfth transistor is connected to the first voltage terminal, and a gate electrode of the thirteenth transistor is connected to the pull-up node, a first electrode of the thirteenth transistor is connected to the pull-down node, and a second electrode of the thirteenth transistor is connected to the first voltage terminal.

7. The shifting register according to claim 6, wherein all the transistors are N-type transistors; or all the transistors are P-type transistors.

8. A driving circuit comprising a plurality of cascaded shifting registers according to claim 1, wherein the output terminal of each level of shifting register is connected to a gate line, the first control terminal of each level, except the first level, of shifting register is connected to the output control terminal of a previous level of shifting register, and the second control terminal of each level, except the last level, of shifting register is connected to the output control terminal of a next level of shifting register.

9. A driving method of a panel, the panel comprising a plurality of gate lines, a plurality of data lines, and the driving circuit according to claim 8, wherein the output terminal of each shifting register of the driving circuit is connected to a corresponding gate line of the plurality of gate lines, each of the gate lines is connected to a row of sub-pixels, and each of the data lines is connected to a column of sub-pixels, a difference in a start time of an output stage between two adjacent levels of shifting register is one third of duration of the output stage, and the output stage of each shifting register comprises a first sub-output stage, a second sub-output, and a third sub-output stage that do not overlap each other; the method comprises:

providing, at the first sub-output stage of a shifting register corresponding to an $n^{th}$ row of sub-pixels, a first data signal corresponding to an $(n-2)^{th}$ row of sub-pixels to each of the data lines;

providing, at the second sub-output stage of the shifting register corresponding to the $n^{th}$ row of sub-pixels, a second data signal corresponding to an $(n-1)^{th}$ row of sub-pixels to each of the data lines, wherein the second data signal has an opposite polarity to the first data signal; and providing, at the third sub-output stage of the shifting register corresponding to the nth row of sub-pixels, a third data signal corresponding to the $n^{th}$ row of sub-pixels to each of the data lines, wherein the third data signal has the same polarity as the first data signal, wherein n is an integer greater than or equal to 3.

10. A driving method of a shifting register, the shifting register comprising:

a shifting register unit circuit configured to transmit a signal of a first voltage terminal to an output terminal and an output control terminal according to a level of a pull-down node, and transmit a signal of a clock terminal to the output terminal and the output control terminal according to a level of a pull-up node; and a control unit circuit configured to transmit the signal of the first voltage terminal to the output terminal according to signals of a first control terminal and a second control terminal, wherein the control unit circuit comprises a first transistor and a second transistor, a first electrode of the first transistor is connected to the output terminal, and a second electrode of the first transistor is connected to the first voltage terminal, and a gate electrode of the second transistor is connected to the first control terminal, a first electrode of the second transistor is connected to the second control terminal, and a second electrode of the second transistor is connected to the gate electrode of the first transistor, the driving method comprising:

transmitting, by the shifting register, the signal of the first voltage terminal to the output terminal during an output stage according to the signals of the first control terminal and the second control terminal.

11. The driving method according to claim 10, wherein the shifting register unit circuit of the shifting register comprises a storage capacitor, an input reset module circuit, an output module circuit, a pull-down control module circuit, and a pull-down module circuit, a first electrode of the storage capacitor is connected to the pull-up node, and a second electrode of the storage capacitor is connected to the output terminal, the input reset module circuit is configured to, based on signals of an input terminal and a reset terminal, write the signal of the input terminal or the signal of the first voltage terminal to the pull-up node, the output module circuit is configured to transmit the signal of the clock terminal to the output terminal and the output control terminal according to the level of the pull-up node, the pull-down control module circuit is configured to write the signal of the first voltage terminal or a signal of a second voltage terminal to the pull-down node according to the level of the pull-up node, and the pull-down module circuit is configured to transmit the signal of the first voltage terminal to the output terminal and the output control terminal according to the level of the pull-down node, wherein a turn-off signal is provided to the first voltage terminal, and a turn-on signal is provided to the second voltage terminal, and the driving method comprises:

providing the turn-on signal to the input terminal and providing the turn-off signal to the reset terminal during a charging stage;

providing the turn-on signal to the clock terminal and providing the turn-off signal to the input terminal and the reset terminal during the output stage;

providing the turn-on signal to the reset terminal and the clock terminal, and providing the turn-off signal to the input terminal during a reset stage; and providing the turn-on signal to the clock terminal and providing the turn-off signal to the reset terminal and the input terminal during a holding stage.

* * * * *